(12) United States Patent
Yoshida

(10) Patent No.: US 7,188,326 B2
(45) Date of Patent: Mar. 6, 2007

(54) METHODS FOR DESIGNING AND TESTING SEMICONDUCTOR INTEGRATED CIRCUITS WITH PLURAL CLOCK GROUPS

(75) Inventor: Takaki Yoshida, Ibaraki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 163 days.

(21) Appl. No.: 10/365,999

(22) Filed: Feb. 12, 2003

(65) Prior Publication Data

US 2003/0154455 A1    Aug. 14, 2003

(30) Foreign Application Priority Data

Feb. 14, 2002  (JP)  ............... 2002-037202

(51) Int. Cl.
*G06F 17/50* (2006.01)
(52) U.S. Cl. .......................................... 716/6; 714/726
(58) Field of Classification Search .................... 716/6; 714/33, 726, 729
See application file for complete search history.

(56) References Cited

U.S. PATENT DOCUMENTS

| | | | |
|---|---|---|---|
| 6,070,260 A | | 5/2000 | Buch et al. |
| 6,079,039 A | | 6/2000 | Nakamura |
| 6,115,827 A | * | 9/2000 | Nadeau-Dostie et al. ... 713/503 |
| 6,145,105 A | * | 11/2000 | Nadeau-Dostie et al. ... 714/726 |
| 6,618,826 B1 | * | 9/2003 | Chen et al. .................. 714/718 |
| 6,625,784 B1 | * | 9/2003 | Ohta et al. ...................... 716/4 |
| 6,877,123 B2 | * | 4/2005 | Johnston et al. ............ 714/731 |
| 2002/0170010 A1 | * | 11/2002 | Saxena et al. .............. 714/726 |
| 2003/0084390 A1 | * | 5/2003 | Tamarapalli et al. ........ 714/744 |

FOREIGN PATENT DOCUMENTS

| | | |
|---|---|---|
| JP | 10-197603 | 7/1998 |
| JP | 11-108999 | 4/1999 |
| JP | 11-110067 | 4/1999 |
| JP | 2000-81862 | 3/2000 |
| JP | 2001-165996 | 6/2001 |

* cited by examiner

*Primary Examiner*—Leigh M. Garbowski
(74) *Attorney, Agent, or Firm*—Hamre, Schumann, Mueller & Larson, P.C.

(57) ABSTRACT

A method is provided for designing a semiconductor integrated circuit including a plurality of clock groups which are designed to be supplied with their respective clock signals. The method is improved by supplying plural kinds of clock signals for performing a scan testing respectively to the clock groups, the respective clock signals having different duty factors in at least a part of the clock groups. This prevents circuits on the plurality of scan lines from operating simultaneously, thus suppressing power consumption during a clock operation, allowing highly accurate testing.

11 Claims, 20 Drawing Sheets

METHODS FOR DESIGNING AND TESTING SEMICONDUCTOR INTEGRATED CIRCUITS WITH PLURAL CLOCK GROUPS

BACKGROUND OF THE INVENTION

1. Field of the Invention

The present invention relates to a method for designing a semiconductor integrated circuit and a method for testing the same, which make it possible to suppress physical influences such as malfunctions caused by a voltage drop owing to simultaneous power consumption and interference between signal lines during a clock operation of a large-scale integrated circuit. As a result, the integrated circuit can be tested efficiently and accurately.

2. Description of Related Art

During scan testing of a semiconductor integrated circuit, a clock is supplied to each scan line in a scan-designed circuit so as to allow a signal to propagate, thereby detecting a fault in the circuit. In other words, as shown in FIG. 25, scan flip-flops 101 to 103 constitute a scan chain on a first scan line 107, while scan flip-flops 104 to 106 constitute a scan chain on a second scan line 108. When a clock 109 is supplied, a scan operation is conducted.

As shown in FIG. 26, in general, a test pattern 113 to be input to a scan line is generated automatically from circuit diagram information 111 by a tool called an ATPG (Automatic Test Pattern Generator) 112.

In general, the same clocks are supplied to the scan lines simultaneously, so signals also are shifted on the scan lines simultaneously. As shown in FIG. 25, a clock pattern for scanning includes a shift-in for setting a signal value to be taken into the circuit, a capture for actually taking the signal value into the circuit and a shift-out for taking out the result of the signal value to the outside of the circuit. Since the scan flip-flops in the circuit are switched simultaneously as described above, a recent trend toward larger-scale and finer integrated circuits has increased power consumption of the circuit during a scan operation and occurrence of malfunctions owing to a voltage drop and interference between signal lines.

For suppressing the power consumption during the scan operation, JP 10(1998)-197603 A describes providing a clock control circuit in the circuit, thereby avoiding simultaneous supply of clocks to a plurality of scan lines. As briefly shown in FIG. 27, three scan lines 121, 122 and 123 are divided into a group A and a group B. Respective clocks 124 and 125 to be input to the groups A and B are controlled by a clock control circuit 126 so as not to be supplied simultaneously to these groups. In this manner, the power consumption is reduced.

However, in the case where the three scan lines 121, 122 and 123 are connected and the circuit of the group A and that of the group B are associated with each other as shown in this figure, an accurate result cannot be obtained unless the captures are input simultaneously. Accordingly, the clocks have to be supplied simultaneously, so that the problem of high power consumption remains.

In order to solve such a problem, JP 2001-165996 A describes a method of designing a circuit in which the scan lines 122 and 123 are not connected and the circuit of the group A and that of the group B are independent from each other as shown in FIG. 28, thereby avoiding the simultaneous performance of capture operations, thus suppressing the power consumption.

However, both of the conventional technologies described above have required circuit constraints. Furthermore, the clock control has been difficult. Thus, there have been problems for practical application.

SUMMARY OF THE INVENTION

It is an object of the present invention to provide a method for designing a semiconductor integrated circuit and a method for testing the same, in which few circuit constraints are needed for suppressing power consumption during a clock operation so as to achieve a highly accurate testing.

In a method of the present invention for designing a semiconductor integrated circuit including a plurality of clock groups which are designed to be supplied with their respective clock signals, the improvement includes supplying plural kinds of clock signals for performing a scan testing respectively to the clock groups. The respective clock signals have different duty factors at least in a part of the clock groups.

It is preferable that the clock signals with different duty factors are supplied respectively to the plurality of clock groups by using a duty changing part for generating a test pattern in which duty factors of scan clocks supplied for the scan testing have been changed. It also is preferable that the duty factors of the clocks are changed according to information regarding the plurality of clock groups. Alternatively, the duty factors of the clocks may be changed according to a placement and routing information of the semiconductor integrated circuit.

Alternatively, the duty factors of the clocks may be changed by providing the semiconductor integrated circuit with a function of changing the duty factors of the clocks to be input respectively to the plurality of clock groups.

It is preferable that capture operations are synchronized based on an information of scan lines in the scan testing.

In a method of the present invention for testing a semiconductor integrated circuit by inputting clock signals for performing a scan testing respectively to a plurality of scan lines included in the semiconductor integrated circuit, the improvement includes supplying plural kinds of clock signals for performing the scan testing respectively to the scan lines. The respective clock signals have different duty factors at least in a part of the scan lines.

It is preferable that the clock signals with different duty factors are supplied to the plurality of scan lines by a duty changing part for generating a test pattern in which duty factors of scan clocks supplied for the scan testing have been changed. It also is preferable that the duty factors of the clocks are changed according to information regarding the plurality of scan lines. Alternatively, the duty factors of the clocks may be changed according to placement and routing information of the semiconductor integrated circuit.

DESCRIPTION OF THE PREFERRED EMBODIMENTS

A method for designing a semiconductor integrated circuit and a method for testing the same according to the present invention can suppress simultaneous power consumption during a scan operation by modifying a test pattern to be supplied to a scan circuit without taking measures in a circuit as in a conventional technology. More specifically, the present invention is directed to a method in which, by changing pulse duty factors of clock signals, circuits on a plurality of scan lines are prevented from operating simultaneously. This makes it possible to suppress physical influences during a clock operation, such as malfunctions caused by a voltage drop owing to simultaneous power consumption and by interference between signal lines, thereby testing the integrated circuit efficiently and accurately. This method can be applied not only to the scan circuit but also to a similar circuit in which synchronized operations are carried out according to clocks.

Figure 1:
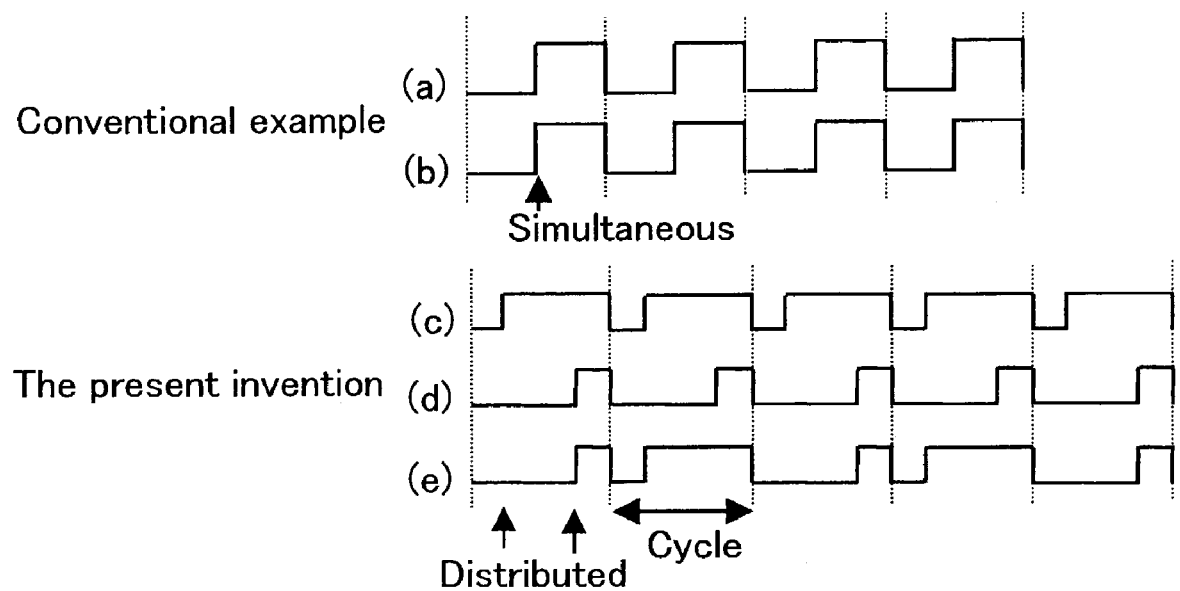
FIG. 1 illustrates clock waveforms for describing a basic concept of the present invention.

An outline of setting clock duty factors will be described with reference to FIG. 1. In FIG. 1, waveforms (a) and (b) show clock waveforms used for different scan lines in a conventional example, while waveforms (c), (d) and (e) show clock waveforms used for different scan lines in the present invention. The waveforms (a) and (b) have the same clock, vary according to the same cycle and have the same clock duty factor. If circuits begin operating when the clock rises, the circuits supplied with this clock begin operating simultaneously. Thus, when the waveforms (a) and (b) are input respectively to a plurality of scan lines, the circuits on these scan lines operate simultaneously.

On the other hand, the waveforms (c), (d) and (e) of the present invention have the same cycle (in which the clock falls) but have different rising edges of the clocks. For example, the waveforms (c) and (d) each have the same rising edges in every cycle, while the waveform (e) has different rising edges of the clock depending on a cycle. The waveforms (c) and (d) have different clock duty factors. If circuits begin operating when the clock rises, inputting the waveforms (c) and (d) respectively to a plurality of scan lines can prevent the circuits on these scan lines from operating simultaneously. The present invention is made by adopting this concept. Hereinafter, preferred embodiments of the present invention will be described, with reference to the accompanying drawings.

First Embodiment

Figure 2:
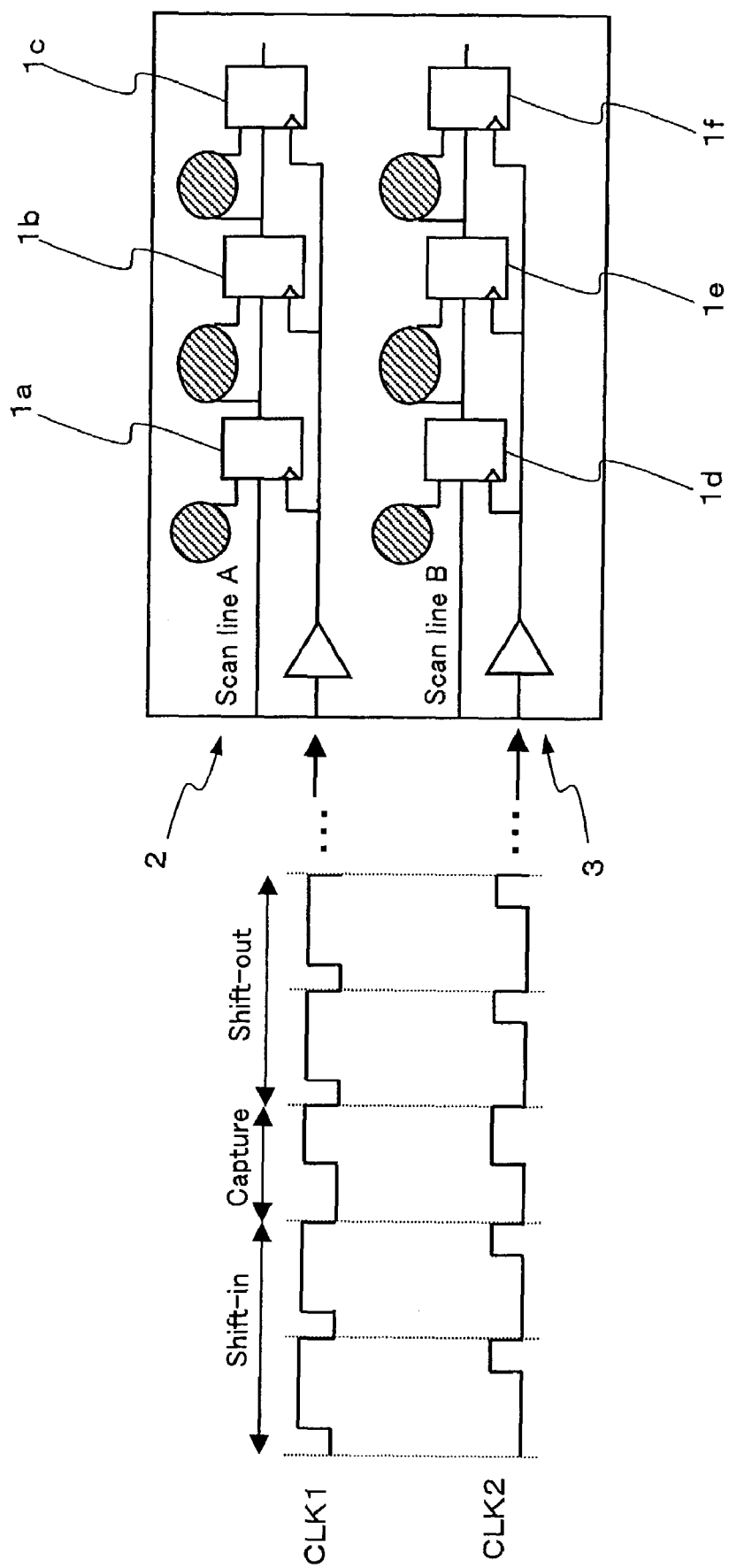
FIG. 2 illustrates exemplary clocks used for scan testing according to a first embodiment of the present invention.

FIG. 2 illustrates a scan testing method in the first embodiment of the present invention. In this method, clocks having different duty factors are input to a plurality of scan lines in a circuit. A clock CLK1 is supplied to a scan line A2 including scan flip-flops 1*a* to 1*c*, while a clock CLK2 is supplied to a scan line B3 including scan flip-flops 1*d* to 1*f*.

In this example, the clock CLK1 and the clock CLK2 have different duty factors in their shift-in and shift-out. In other words, during the shift operations, the scan line A2 and the scan line B3 do not operate simultaneously but operate at times shifted from each other, so that instantaneous power consumption can be suppressed. This makes it possible to suppress abnormality of a scan operation owing to power consumption during the scan operation, thus improving the accuracy of scan testing.

In the present embodiment, the patterns of the clocks during capture have the same duty factor. In the case where respective circuits associated with the scan line A2 and the scan line B3 are not connected with each other, the clock patterns during the capture do not have to have the same duty factor.

Figure 3:
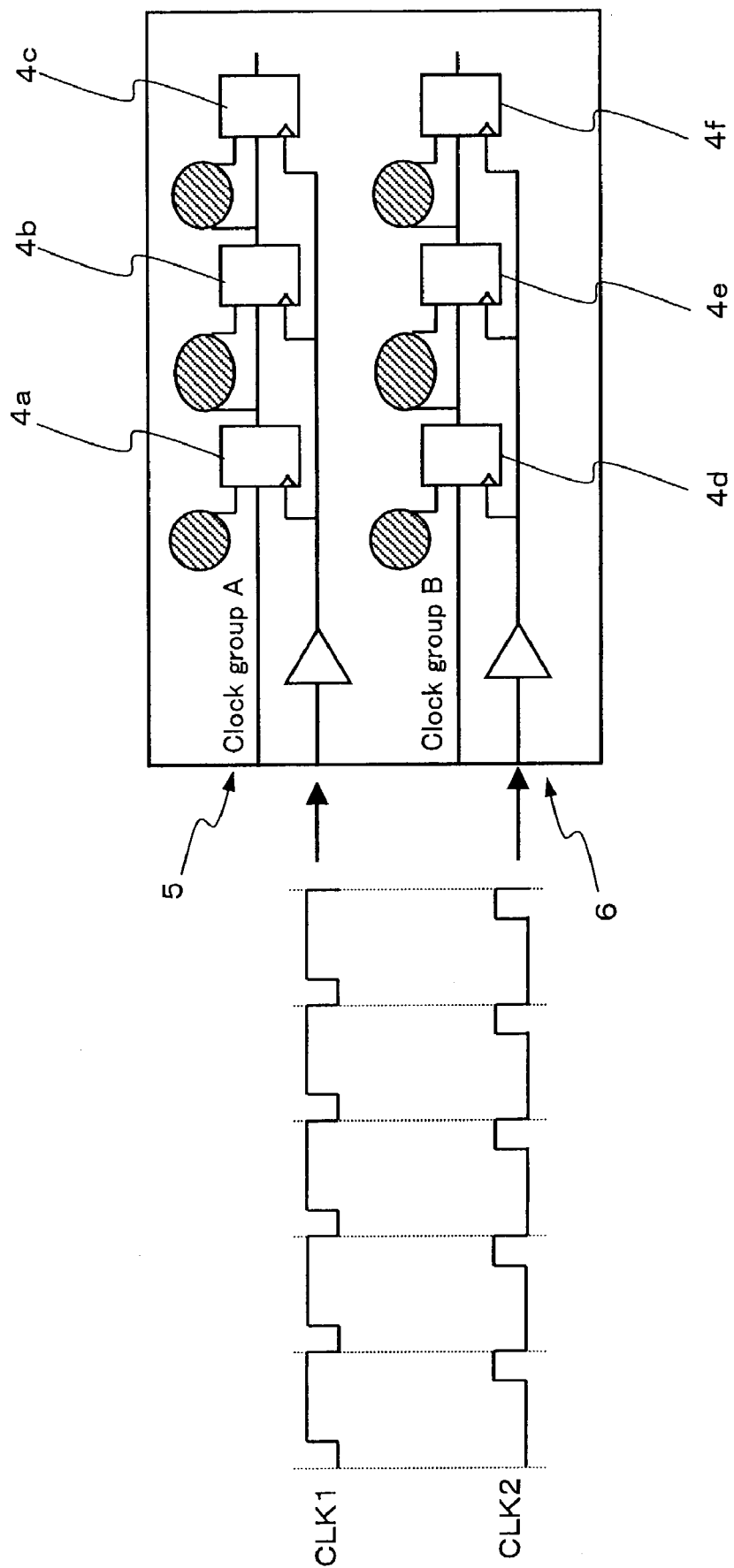
FIG. 3 shows a case where the clocks of the first embodiment of the present invention are applied to a regular synchronous circuit.

The method according to the present embodiment can be applied not only to the scan testing but also to a regular synchronous design circuit. For example, as shown in FIG. 3, by changing clock duty factors to be input respectively to a clock group A5 and a clock group B6 including flip-flops 4a to 4f and using the clocks CLK1 and CLK2, it also is possible to obtain an effect of suppressing power consumption as in the case of the scan testing.

Second Embodiment

Figure 4:
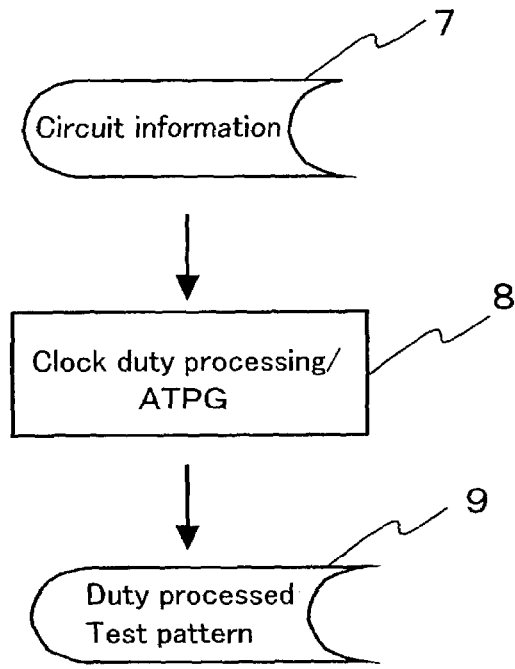
FIG. 4 is a flowchart of how a test pattern is generated automatically in a second embodiment of the present invention.
Figure 26:
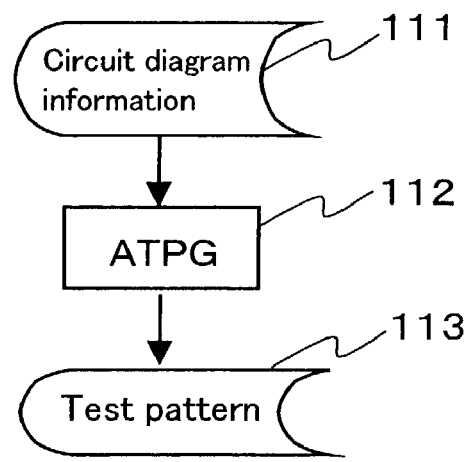
FIG. 26 is a flowchart of how a scan pattern is generated automatically by an ATPG in the conventional example.
Figure 27:
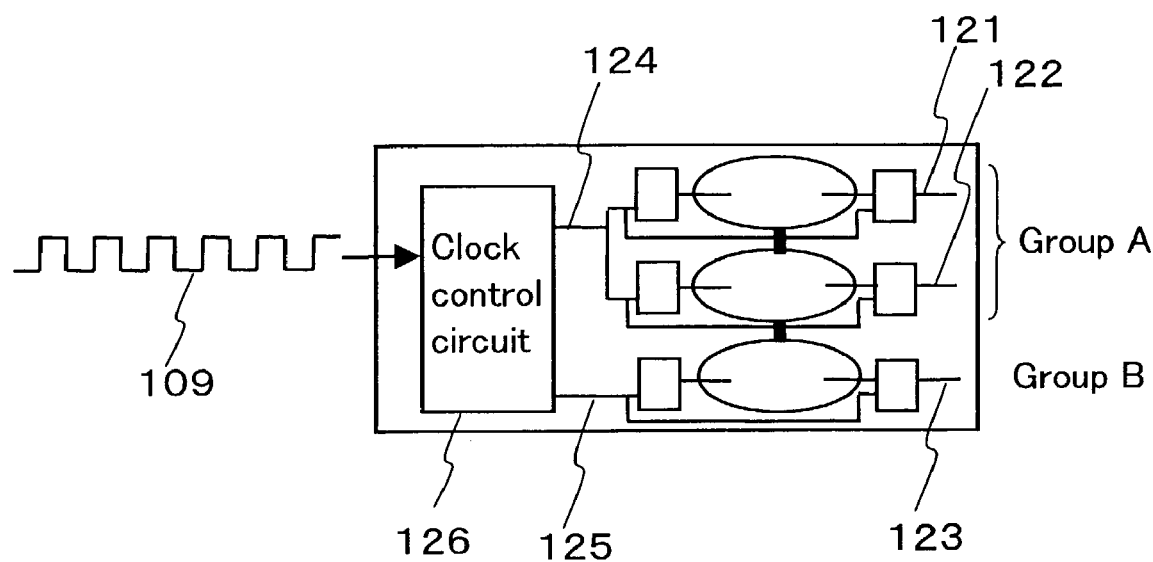
FIG. 27 illustrates an exemplary circuit for taking measures to suppress power consumption in the scan testing in the conventional example.
Figure 28:
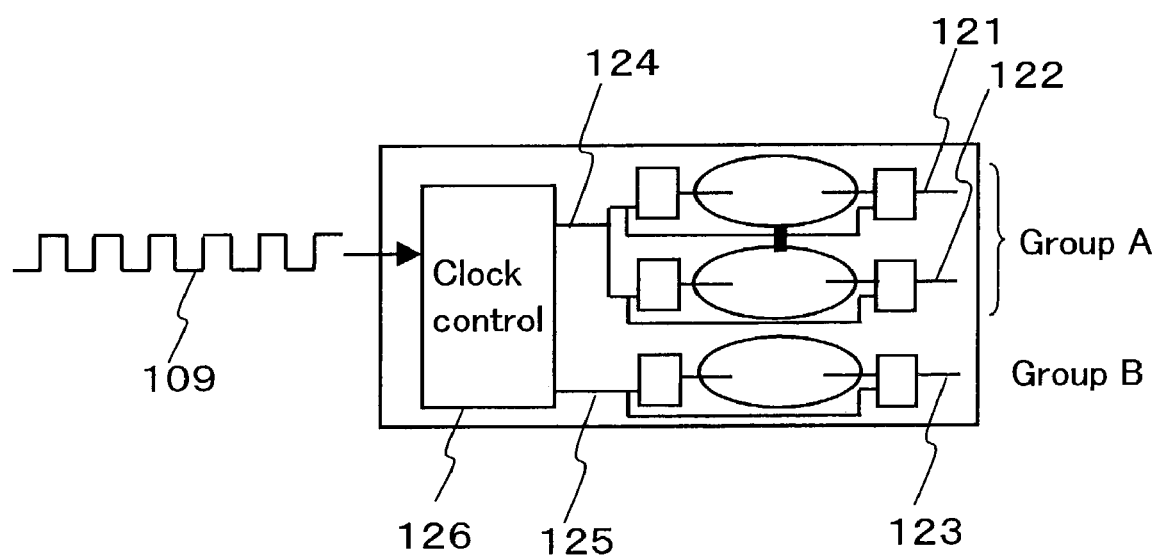
FIG. 28 illustrates another exemplary circuit for taking measures to suppress power consumption in the scan testing in the conventional example.

FIG. 4 is a flowchart of how a test pattern is generated automatically in the second embodiment of the present invention. The test pattern to be input to a scan line is generated automatically by the tool called the ATPG as shown in FIG. 26. In the present embodiment, as shown in FIG. 4, based on circuit information 7, an ATPG 8 processes a clock duty factor and generates automatically a test pattern 9 whose clock duty factor has been modified.

According to the flowchart shown in FIG. 4, the clocks CLK1 and CLK2 shown in FIG. 2 can be generated automatically, for example. In this manner, it becomes possible to change clock duty factors automatically according to circuit information, thereby making it easier to suppress power consumption and perform testing efficiently and accurately.

In the case where the circuit information indicates that circuits associated with the scan lines to be supplied with the test patterns are not connected with each other, the clocks during the capture do not have to have the same duty factor.

Third Embodiment

Figure 5:
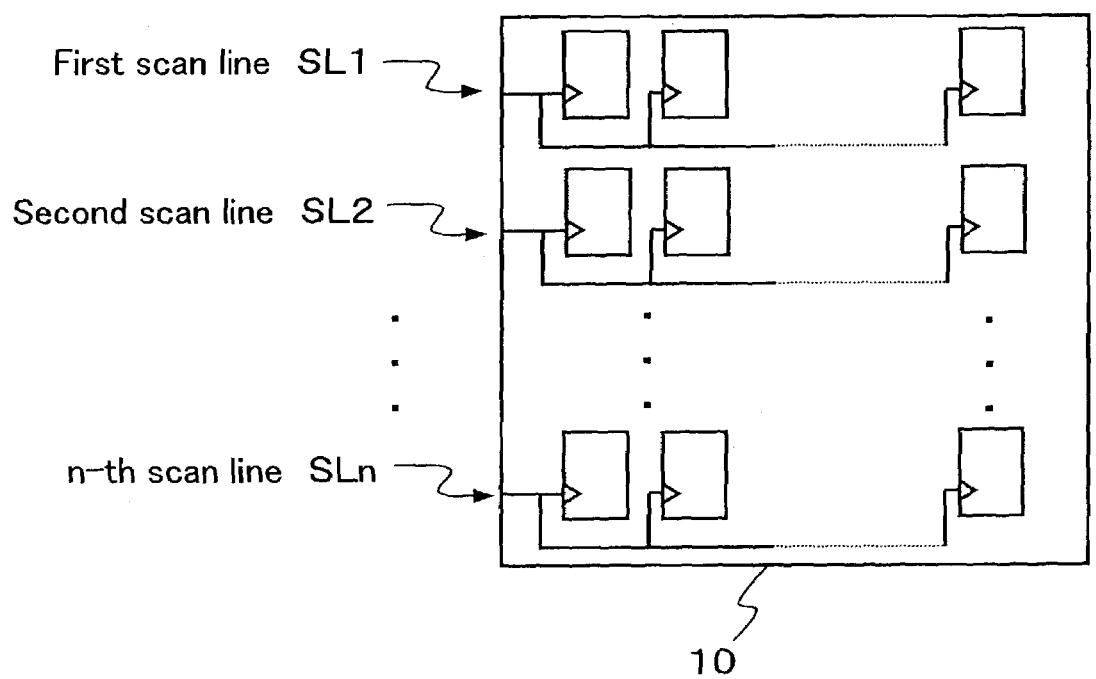
FIG. 5 illustrates a method for changing clock duty factors according to information of scan lines in a third embodiment of the present invention.
Figure 6:
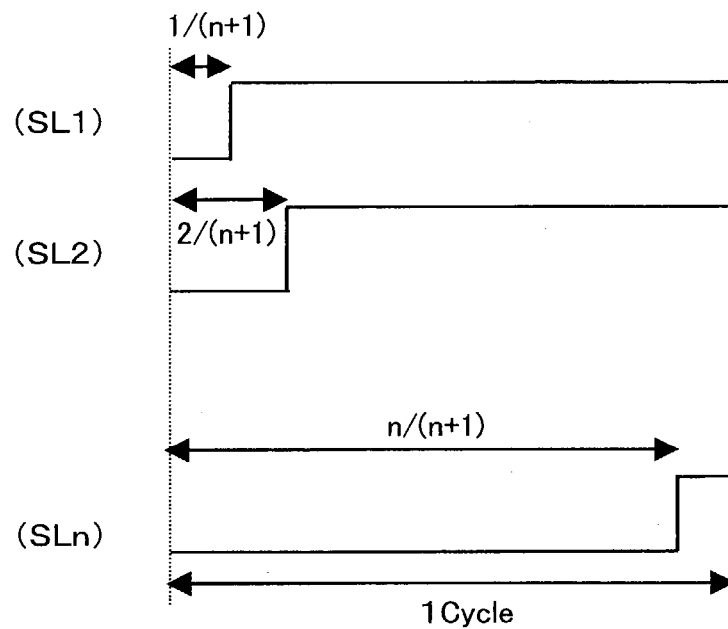
FIG. 6 shows clock duty factors changed according to the information of the scan lines in the third embodiment of the present invention.
Figure 7:
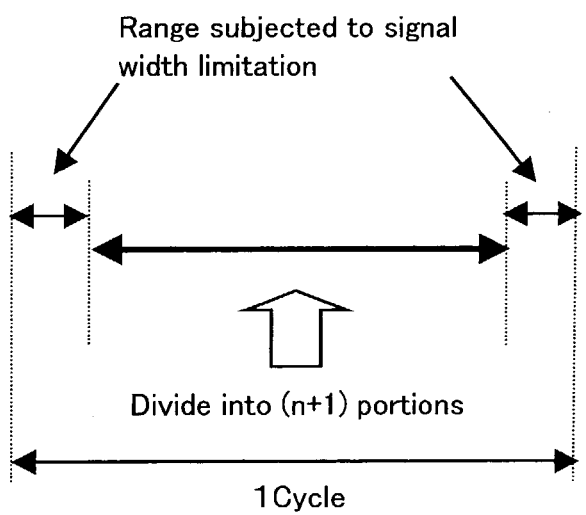
FIG. 7 illustrates the method for changing the clock duty factors according to the information of the scan lines in the third embodiment of the present invention.

A testing method in the third embodiment of the present invention includes a method for changing scan clock duty factors according to information of scan lines in a circuit. The following is an example where n scan lines, i.e., a first scan line SL1 to an n-th scan line SLn are present in a circuit of an LSI 10 as shown in FIG. 5. FIG. 6 shows clocks to be supplied respectively to the scan lines of FIG. 5. The clocks in FIG. 6 are constituted by dividing one cycle into (n+1) equal portions and shifting rising edges of these clocks by a 1/(n+1) cycle for every scan line. Incidentally, since there are some cases where clocks are not input correctly unless the clock has at least a minimum signal width, only a portion free from a signal width limitation in the cycle may be divided into (n+1) equal portions as shown in FIG. 7.

Figure 8:
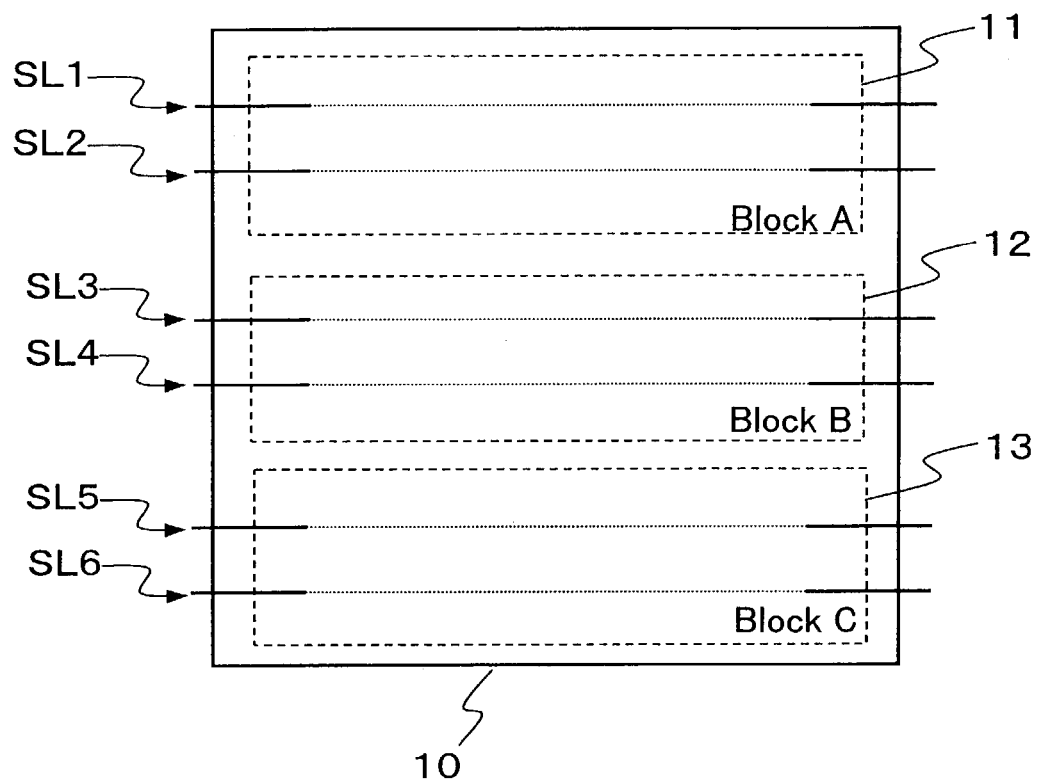
FIG. 8 illustrates another method for changing clock duty factors according to information of scan lines in the third embodiment of the present invention.

Further, even without dividing each of the cycles into (n+1) equal portions and changing the duty factors so as to shift their clocks minutely by each of these equal portions for every scan line, the scan lines also may be divided into groups so as to divide one cycle for each of these groups, making it possible to produce a higher effect of reducing power consumption compared with the case where the clock duty factor is not changed. FIG. 8 illustrates an example of dividing an entire circuit into three blocks. The first scan line SL1 and the second scan line SL2 are in a block A11, the third scan line SL3 and the fourth scan line SL4 are in a block B12, and the fifth scan line SL5 and the sixth scan line SL6 are in a block C13. In this case, only the clock duty factors of the scan lines in the blocks that are easily influenced by each other may be changed. For example, the scan clocks to be input to the first scan line SL1 and the second scan line SL2 in the block A11 are made to have duty factors shifted from each other, but their relationships with respect to the third scan line SL3 to the sixth scan line SL6 are not adjusted.

In accordance with the present embodiment, it becomes possible to change duty factors accurately and efficiently for reducing the power consumption.

Figure 9:
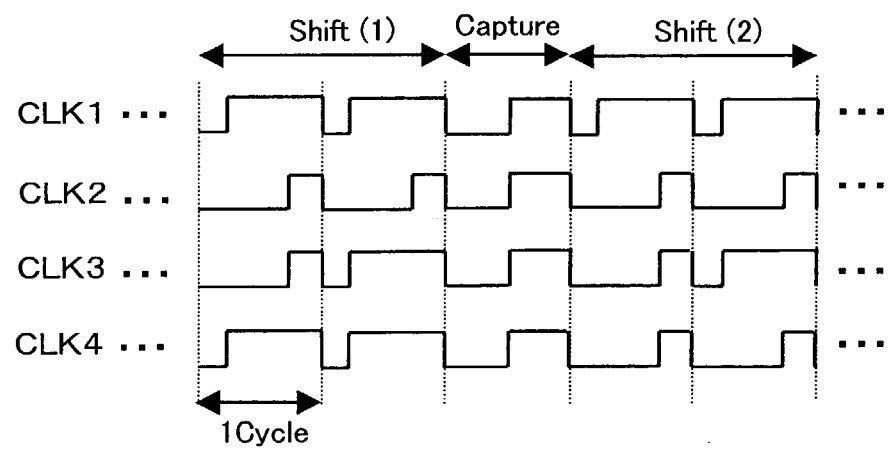
FIG. 9 shows how to shift the clock duty factors in the third embodiment of the present invention.

FIG. 9 illustrates how to shift the duty factors of the scan clocks. Although the above-described embodiments have been directed to the case where the duty factors are shifted similarly throughout the cycles of each of the clocks such as the case of the scan clocks CLK1 and CLK2, the duty factors also may be shifted differently in each cycle within one scan clock such as in the case of a scan clock CLK3. Furthermore, the clock duty factors in a shift (2) also may be different from those in a shift (1) as in a scan clock CLK4.

Fourth Embodiment

Figure 10:
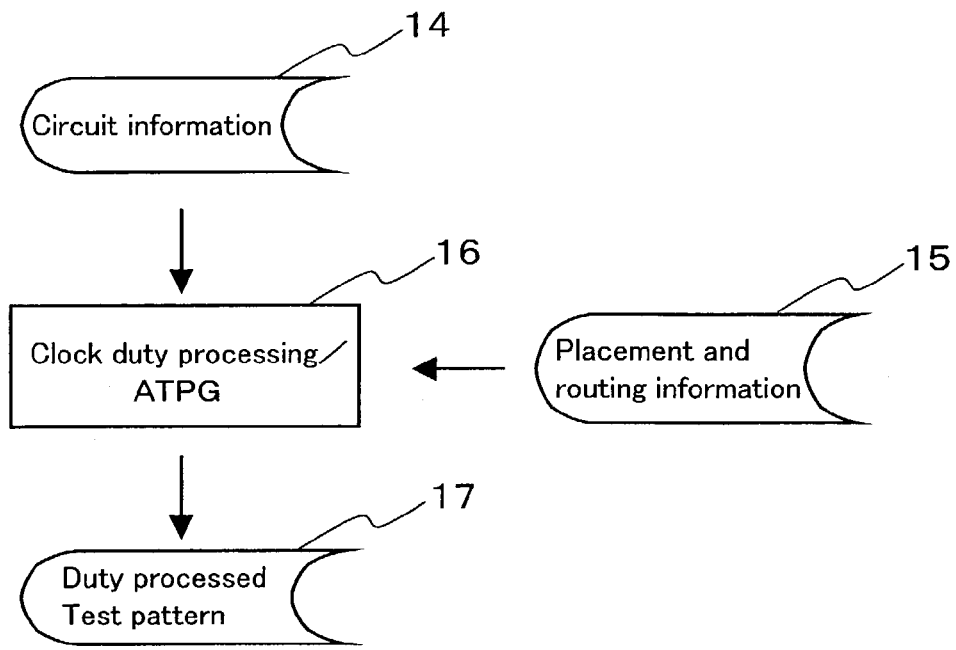
FIG. 10 is a flowchart showing a flow of changing a clock duty factor according to placement and routing information and automatically generating a scan pattern in a fourth embodiment of the present invention.

FIG. 10 illustrates a method for generating a test pattern in the fourth embodiment of the present invention. In the present embodiment, the duty factor of a scan clock is changed by an ATPG 16, referring not only to circuit information 14 but also to placement and routing information 15 including mask information such as a physical positional relationship between scan lines and power supply wirings influencing power consumption, when generating a test pattern 17.

When thinking about the power consumption, the power supply wirings for supplying an electric power are taken into account. When the scan lines are close to each other or placement and routing blocks including the scan lines are close to each other, the electric power is supplied from the same power supply wiring, and thus such dispositions affect the power consumption considerably. When the scan lines are close to each other in terms of placement and routing or physical positions, by changing the duty factors of the scan clocks to be input to these scan lines, the influence is alleviated. Conversely, when the scan lines are away from each other, the need for changing duty factors decreases. With this method, it becomes possible to change duty factors accurately and efficiently for reducing the power consumption.

Furthermore, in recent large-scale LSIs, more and more abnormalities of their operations have been caused by physical phenomena such as an IR-DROP and crosstalk. Similar abnormalities are likely to occur in scan testing. When the scan lines are close to each other, such phenomena are likely to occur. In the case where the scan lines are physically close to each other or associated with the same power supply wiring, a physical phenomenon other than the power consumption can be reduced by taking measures to change the clock duty factors or the like. As the placement and routing information, information on how likely the IR-DROP and crosstalk will occur, obtained by evaluating a specific IR-DROP value and a crosstalk occurrence, also may be used.

The method according to the present embodiment can be applied not only to the scan testing but also to a regular synchronous design circuit. By changing the clock duty factors to be input in view of placement and routing information between the plurality of clock groups A and B as shown in FIG. 3, it is possible to obtain an effect of suppressing the simultaneous power consumption as in the case of the scan testing.

Fifth Embodiment

Figure 11:
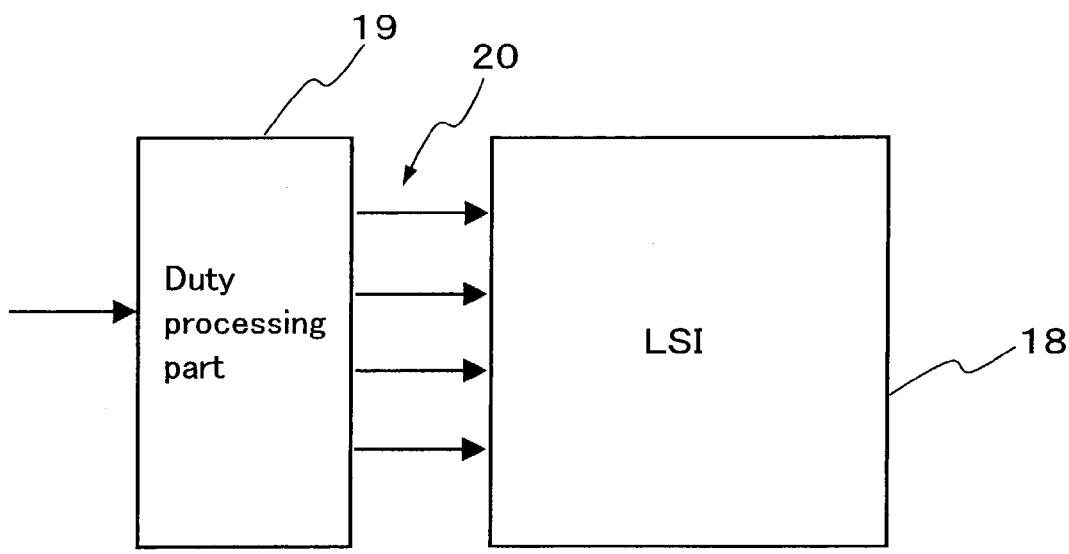
FIG. 11 illustrates a method for changing the scan clock duty factors outside an LSI in the first to fourth embodiments of the present invention.

A testing method in the fifth embodiment of the present invention is directed to an example of employing a method other than that in the above-described embodiments when generating a scan pattern in which a duty factor of a scan clock is modified. The above-described embodiments have illustrated the method of generating outside an LSI the test patterns in which the duty factors of the scan clocks to be supplied to the scan lines are modified and then supplying these test patterns to the LSI as in the configuration shown in FIG. 2. In other words, as shown in FIG. 11, each duty factor of the scan clock is changed by a duty processing part 19 outside an LSI 18. In these examples, the LSI 18 is supplied with a plurality of kinds of scan clocks 20 with different duty factors.

Figure 12:
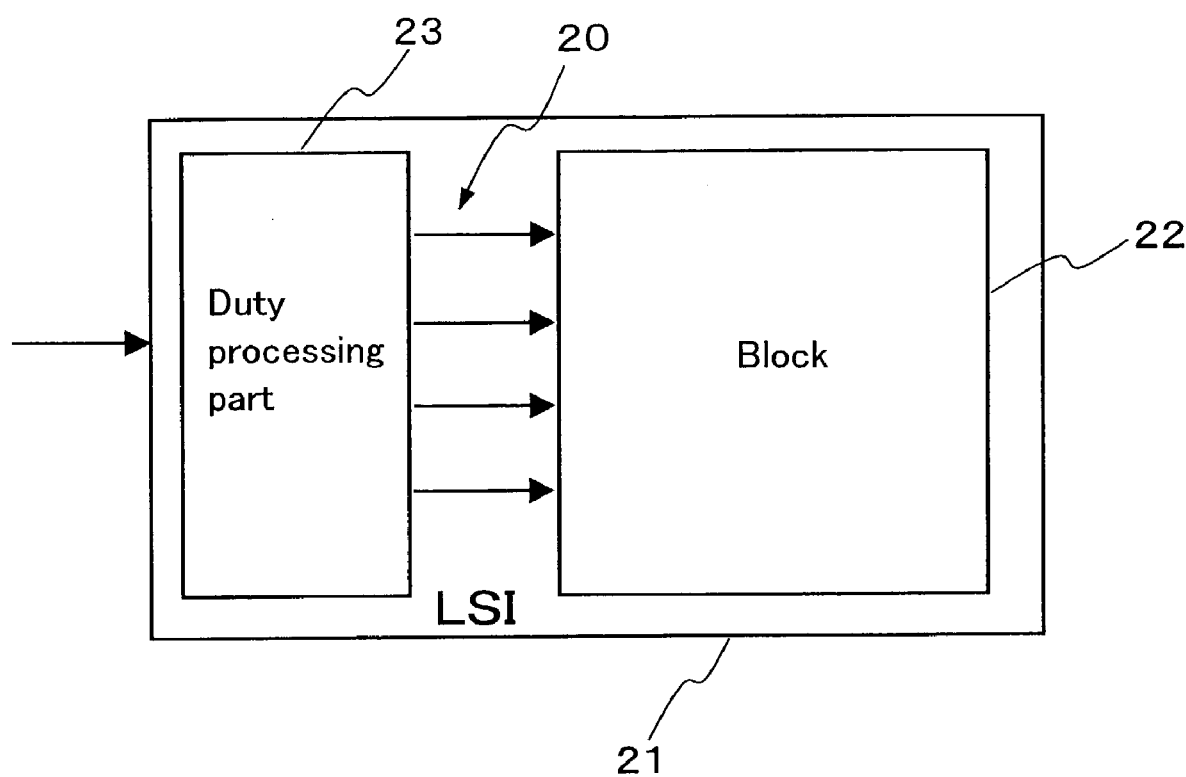
FIG. 12 illustrates a method in which a circuit for changing the clock duty factors is incorporated into an LSI in a fifth embodiment of the present invention.

On the other hand, in the present embodiment, as shown in FIG. 12, not only a block 22 including a circuit to be tested but also a duty processing part 23 serving as a circuit for modifying the clock duty factors is incorporated in an LSI 21. The duty processing part 23 changes duty factors of scan clocks to be supplied to a plurality of scan lines, and the resultant plurality of kinds of scan clocks 20 with different duty factors are supplied respectively to a plurality of scan lines. By incorporating the circuit for changing the clock duty factors in the LSI, it becomes possible to change the duty factors automatically without processing test patterns to be supplied to the LSI in a scan operation.

For example, in the case of generating a self-diagnostic circuit such as a scan-based logic BIST (built-in self-test), a circuit for changing a clock duty factor also is provided, making it possible to reduce a power consumption during a scan operation, thus improving test accuracy. Since an internal operation in the logic BIST cannot be seen from the outside, such provision is absolutely necessary.

Figure 13:
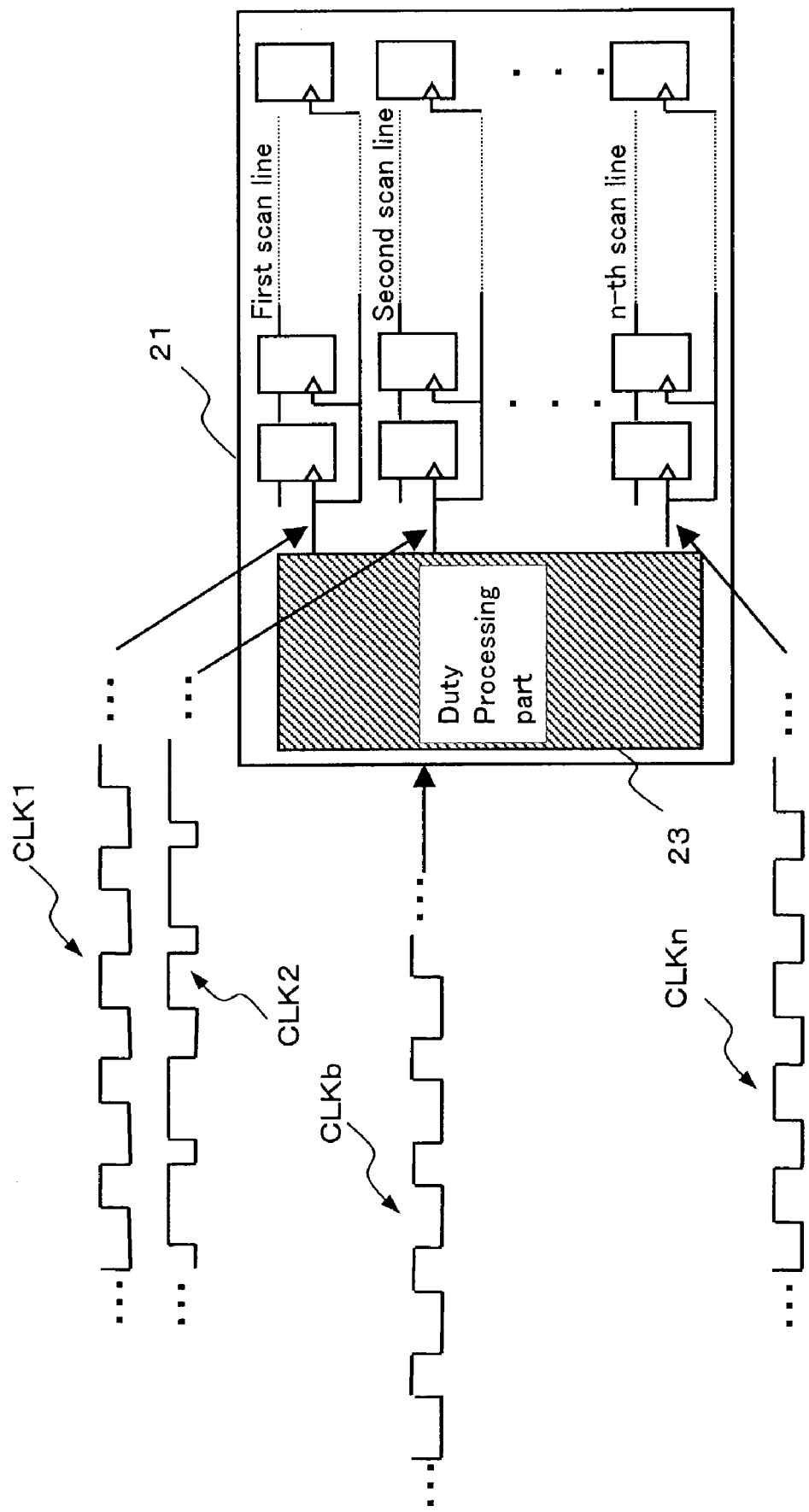
FIG. 13 illustrates an outline of a specific circuit for realizing a configuration of FIG. 12.

FIG. 13 illustrates an outline of a specific circuit. The clocks CLK1, CLK2, ... CLKn are supplied to the scan lines SL1, SL2, ... SLn via the duty processing part 23 that is incorporated in the LSI 21. The duty processing part 23 processes a single clock CLKb supplied from outside of the LSI so as to change the clock duty factors and generates the clocks CLK1, CLK2, ... CLKn.

Figure 14:
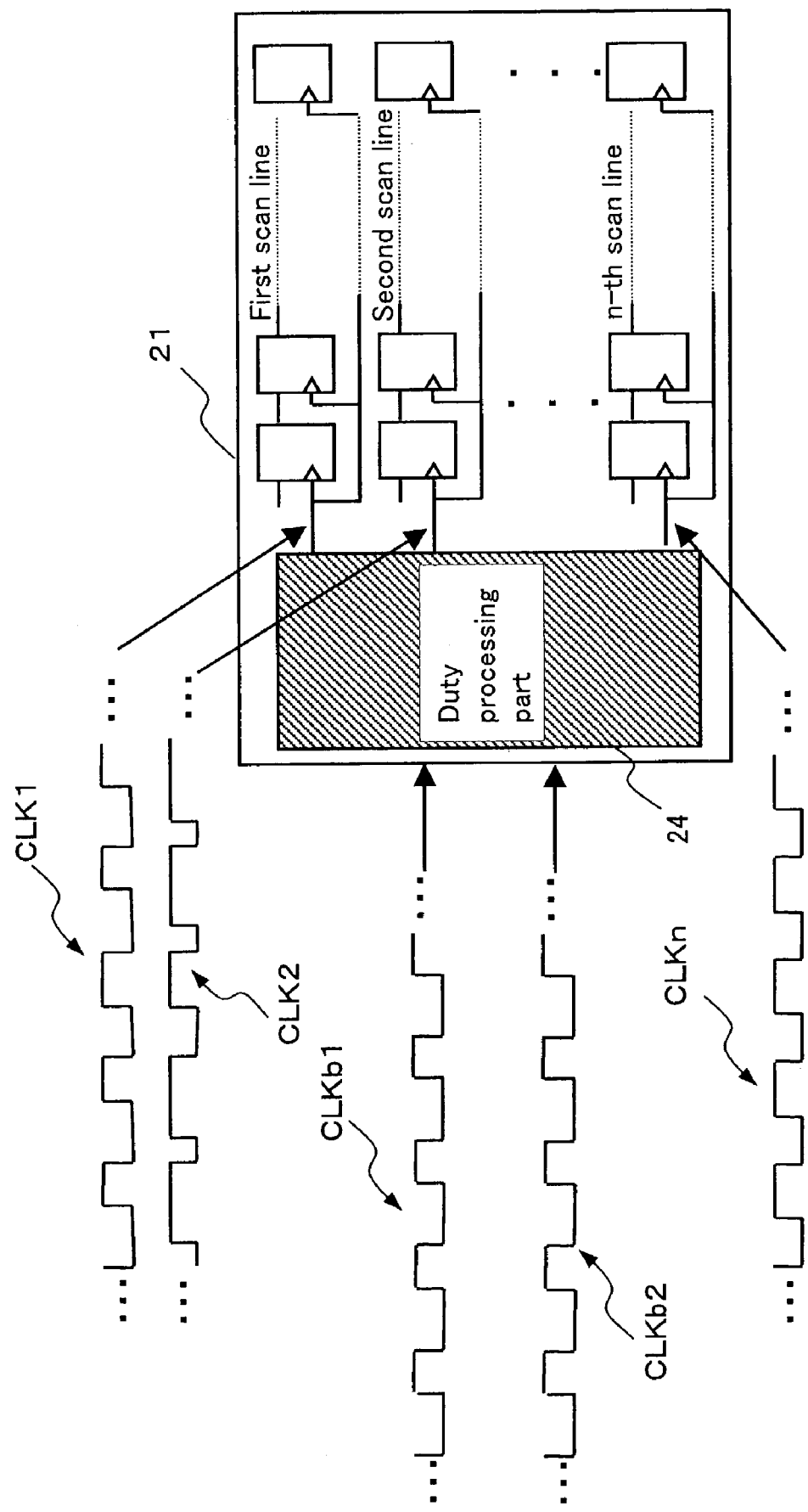
FIG. 14 illustrates a method of incorporating the circuit for changing the clock duty factors into the LSI and inputting a plurality of clocks from the outside of the LSI in the fifth embodiment of the present invention.

On the other hand, in the case of supplying a plurality of clocks from the outside of the LSI, it is possible to process the duty factors outside the LSI as described referring to FIG. 11. It also may be possible, as shown in FIG. 14, to supply a plurality of clocks CLKb1 and CLKb2 from the outside of the LSI 21 and further incorporate a duty processing part 24 into the LSI.

Figure 15:
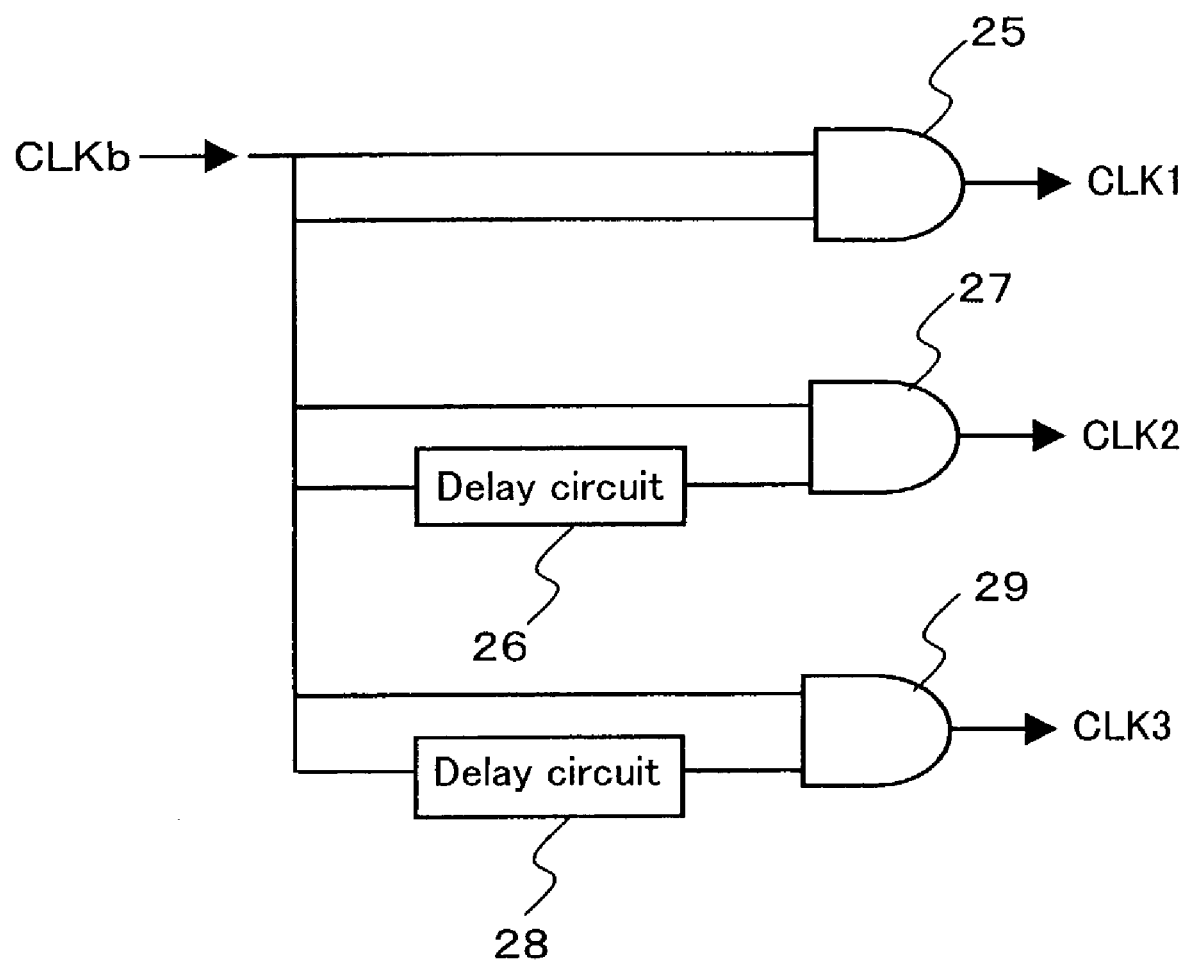
FIG. 15 illustrates an exemplary circuit for processing the clock duty factors in the fifth embodiment of the present invention.

FIG. 15 illustrates an exemplary circuit of the duty processing part 23 in the configuration of FIG. 13. The single basic clock CLKb is input, and the scan clocks CLK1, CLK2 and CLK3 that are supplied to first to third scan lines and whose duty factors are changed are generated. The scan clock CLK1 for the first scan line is an output of an AND gate 25 to which the basic clock CLKb alone is input. The scan clock CLK2 is an output of an AND gate 27 to which the basic clock CLKb and an output of a delay circuit 26 are input. The scan clock CLK3 is an output of an AND gate 29 to which the basic clock CLKb and an output of a delay circuit 28 are input. In this manner, the scan clocks CLK2 and CLK3 have different duty factors obtained by processing the duty factor of the basic clock CLKb by the delay circuits 26 and 28 respectively. It should be understood that this example is directed to an exemplary circuit in the case where each signal operates in the same cycle.

Figure 16:
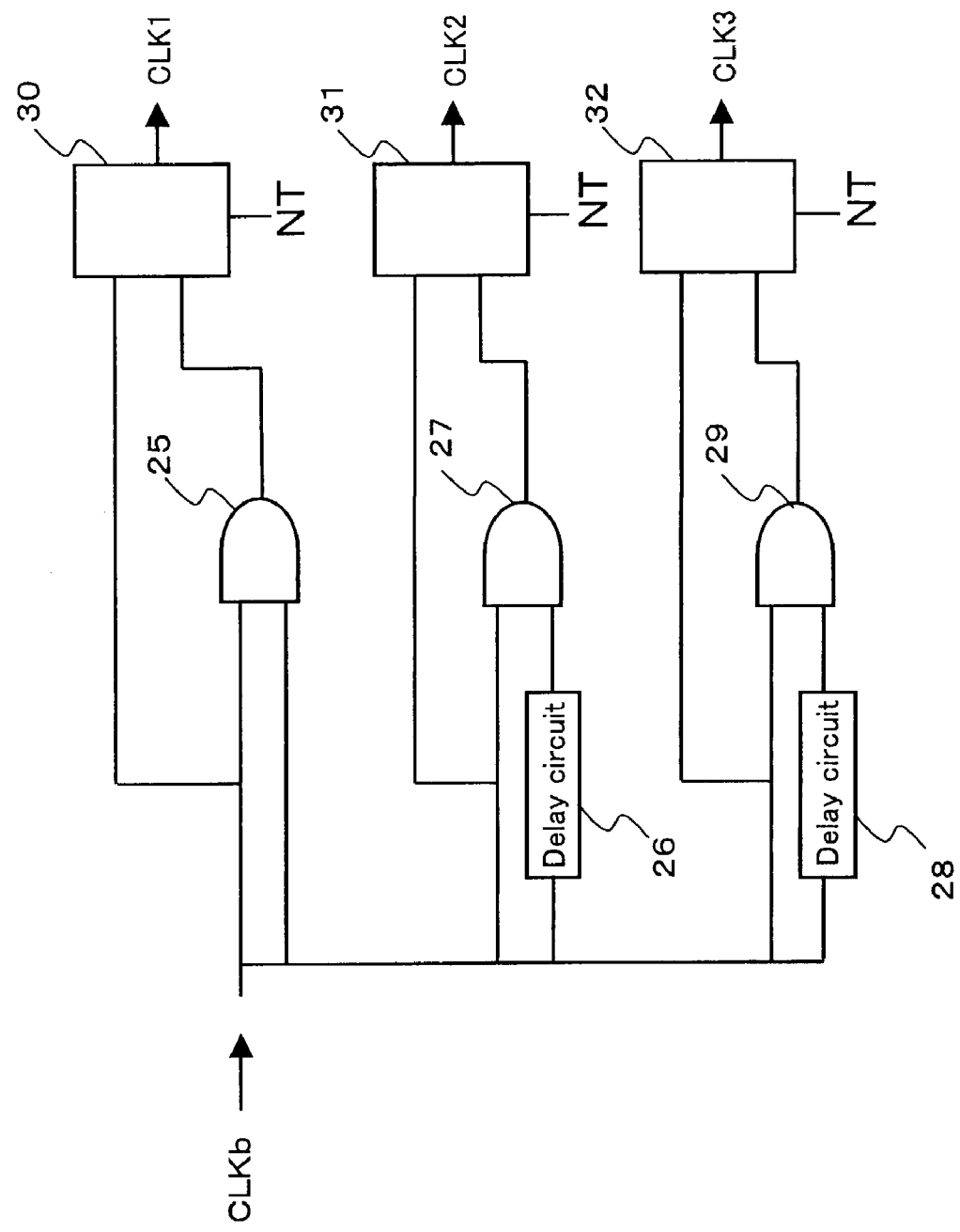
FIG. 16 illustrates an exemplary circuit for processing the clock duty factors so as to provide the same clock during scan capture in the fifth embodiment of the present invention.

FIG. 16 illustrates an example of adding switching circuits 30, 31 and 32 for achieving the same scan captures to the configuration shown in FIG. 15. The capture and shift are switched by NT signals, and during the capture the basic clock CLKb is output from the switching circuits 30, 31 and 32 so that the same clocks are supplied to all the scan lines.

Figure 17:
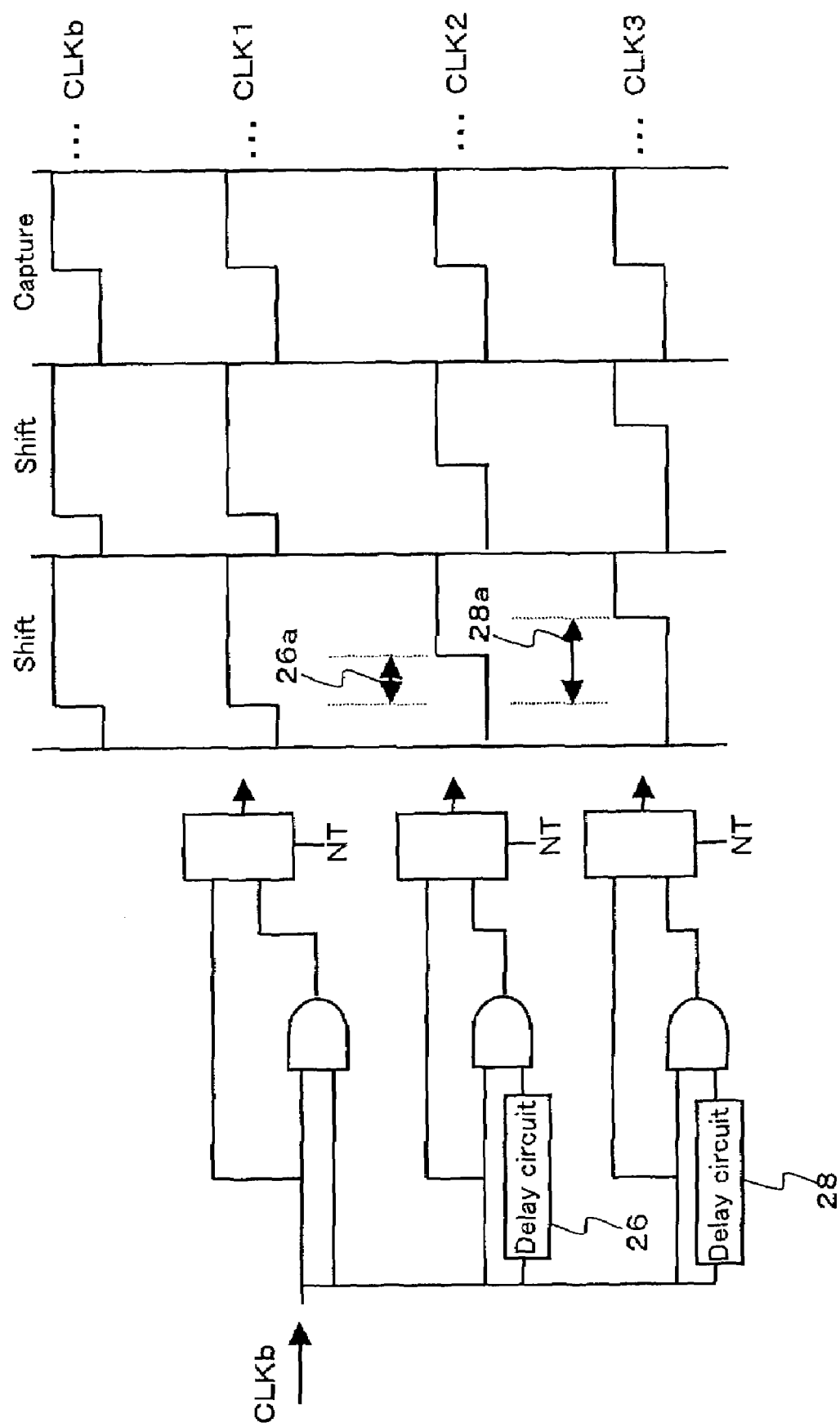
FIG. 17 illustrates scan operation waveforms in the fifth embodiment of the present invention.

FIG. 17 illustrates scan operation waveforms in the configuration shown in FIG. 15 or 16. The single basic clock CLKb is supplied from outside, and the duty processing part supplies the scan clocks CLK1, CLK2 and CLK3 having the same cycle and different duty factors to the first to third scan lines respectively during the shift operation. Numeral 26a indicates a delay time by the delay circuit 26, and numeral 28a indicates a delay time by the delay circuit 28. During the capture operation, by switching with the NT signal, a clock that is the same as the basic scan clock CLKb is supplied to all the scan lines.

Figure 18:
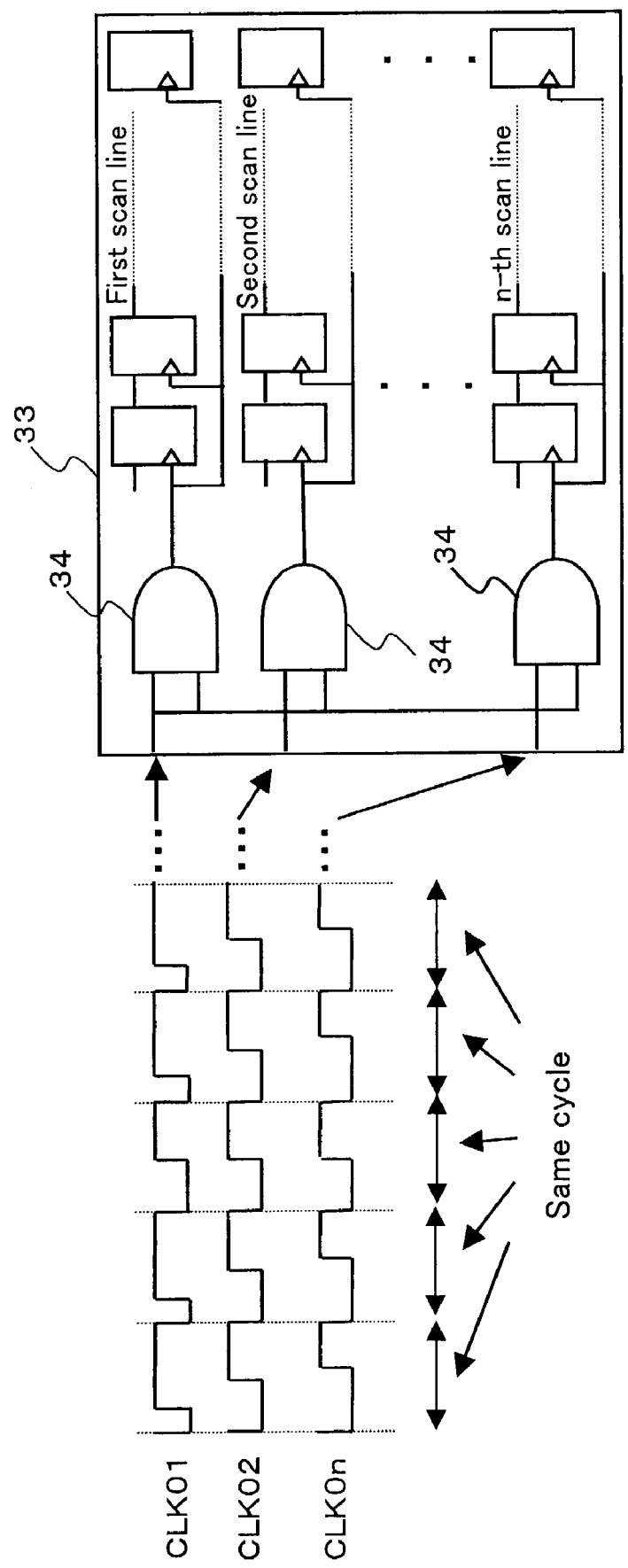
FIG. 18 illustrates an example of adding circuits for synchronizing signals to the exemplary circuit in the fifth embodiment of the present invention.

FIG. 18 illustrates an exemplary circuit in which measures are taken when supplying a plurality of clocks from the outside of the LSI, as illustrated by FIGS. 11 and 14. Inside an LSI 33, scan clocks are supplied to first to n-th scan lines via AND gates 34. These AND gates 34 respectively are supplied with clocks CLK01, CLK02 to CLK0n from the outside of the LSI 33. One of terminals in each of the AND gates 34 is supplied with the clock CLK01 as a synchronous reference clock.

Although input signals to the LSI 33 are supplied from an LSI tester, there is a possibility that intended input signals are not supplied owing to skew of the tester, so that the plurality of these signals cannot be synchronized. In such cases, cycles of the scan clocks may be shifted, impairing the accuracy of the scan testing. The configuration of FIG. 18 is directed to an example of adding the AND gates 34 serving as circuits for synchronizing the signals to be supplied to the scan lines so that the cycles of these signals match. These circuits make it possible to supply the scan clocks whose duty factors have been processed outside the LSI to the scan lines reliably in the same cycle.

The methods illustrated in the present embodiment can be applied not only to the scan testing but also to a regular synchronous design circuit. By providing the circuits for changing the clock duty factors inside the LSI and changing the duty factors of the clocks to be input between a plurality of the clock groups, it is possible to obtain an effect of suppressing the power consumption as in the case of the scan testing.

Sixth Embodiment

Figure 19:
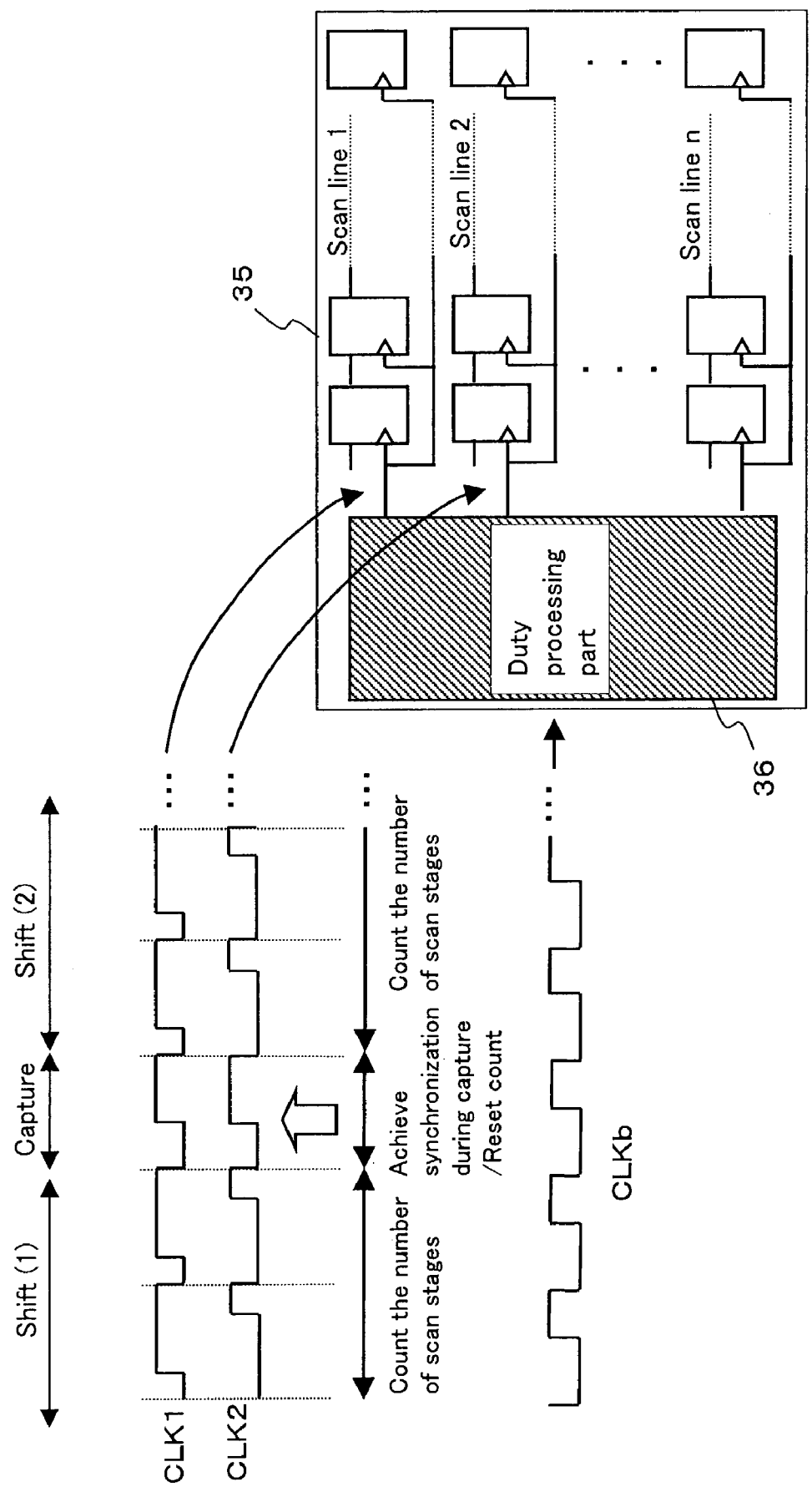
FIG. 19 illustrates an exemplary circuit having a function of synchronizing capture operations according to information of scan lines in a scan testing in a sixth embodiment of the present invention.
Figure 20:
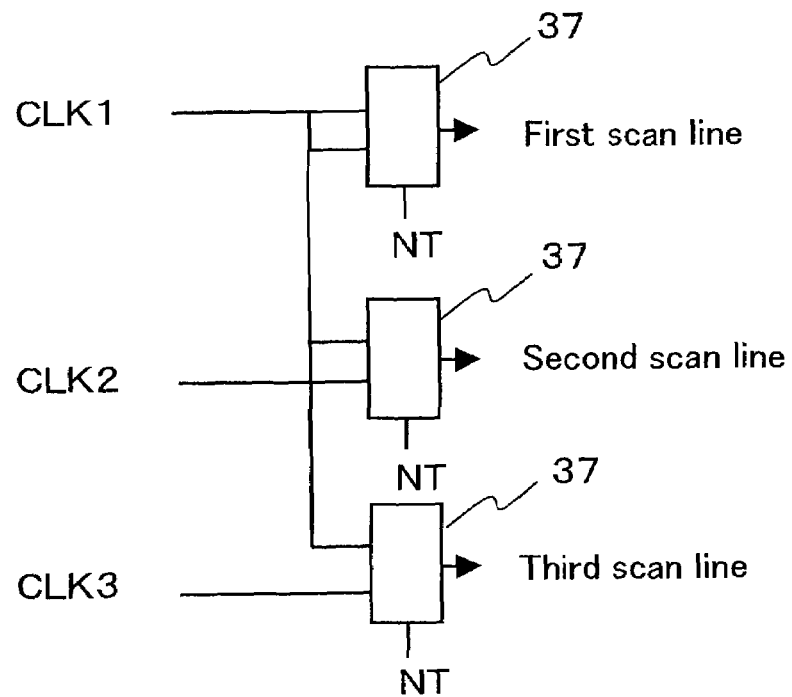
FIG. 20 illustrates an exemplary circuit for controlling operations of scan captures by NT signals in the sixth embodiment of the present invention.

FIGS. 19 and 20 illustrate an example in which a circuit for achieving synchronization during a capture operation is incorporated into an LSI circuit, in the sixth embodiment of the present invention. In other words, this is an example in which, in a scan designing, synchronization is achieved during a capture operation even if duty factors are changed or delayed during shift operations.

In the configuration of FIG. 19, an LSI 35 includes a duty processing part 36 for processing duty factors and achieving synchronization during the capture operation. The duty processing part 36 processes a clock CLKb supplied from outside of the LSI 35, generates clocks CLK1, CLK2, ... CLKn with different duty factors and supplies them to respective scan lines SL1, SL2, ... SLn. Also, the duty processing part 36 counts the number of stages of the scan lines during a shift operation, thereby achieving synchronization during the capture operation. Then, the duty processing part 36 resets the count and counts again the number of stages of the scan lines during the subsequent shift operation.

FIG. 20 illustrates an exemplary circuit in which NT signals operate switching circuits 37 at the time of scan capture so that the clock CLK1 that is the same as the basic clock is supplied to all the scan lines. In other words, during the scan capture, synchronization of the capture operation is achieved by supplying the signal of the basic clock commonly to all the scan lines. The switching circuits 37 are switched by the NT signals in response to the above-mentioned counting.

In the case where the scan lines are independent from each other, the clock duty factors may remain changed also during the capture operations.

Seventh Embodiment

A testing method in the seventh embodiment of the present invention will be explained with reference to FIGS. 21 and 22. An LSI is tested by supplying signals from a tester to the LSI and verifying signals output from the LSI.

Figure 21:
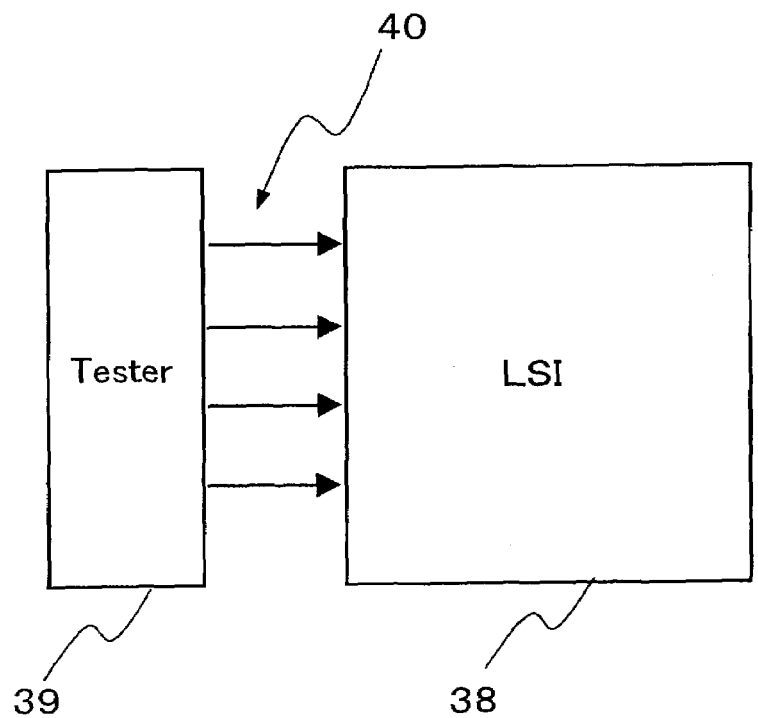
FIG. 21 illustrates an exemplary testing of providing clock signals with different duty factors from a tester to an LSI in a seventh embodiment of the present invention.

FIG. 21 illustrates an example of supplying a plurality of clock signals 40 with different duty factors from a tester 39 to scan lines of an LSI 38, thus testing the LSI 38. The tester 39 has a function of changing duty factors, thereby generating automatically patterns to be supplied to the LSI 38 with clock duty factors changed. By adding the function of changing duty factors to the tester 39, it is possible to lower power consumption at the time of scanning the LSI 38 and improve a test accuracy while reducing cares during designing.

Figure 22:
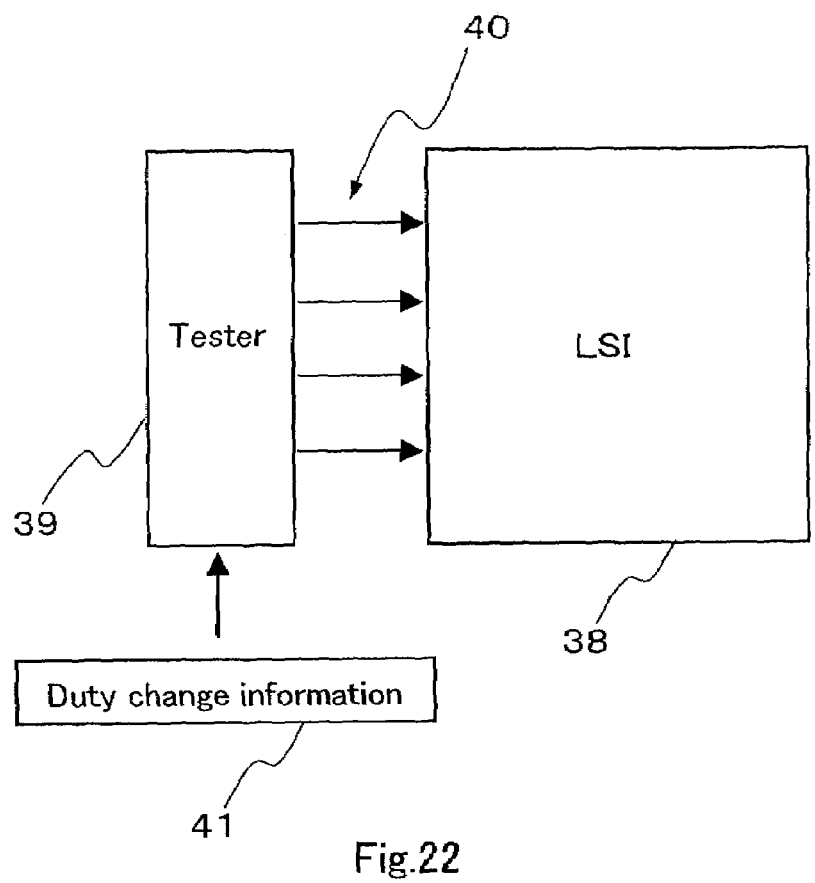
FIG. 22 illustrates an example of providing duty change information to the tester in the method shown in FIG. 21.

FIG. 22 illustrates an example of supplying the tester 39 with circuit information of the scan lines and the like as duty change information 41. Based on the duty change information, scan clocks whose duty factors are changed according to this information are automatically generated, clock signals with different duty factors are supplied from the tester 39 to the scan lines of the LSI 38, thus testing the LSI 38. As the duty change information 41 to be supplied to the tester 39, information on how to change duty factors of the scan lines from placement and routing information or the placement and routing information itself may be included. This makes it possible to change the duty factors more accurately and efficiently for reducing the power consumption.

Eighth Embodiment

A testing method in the eighth embodiment of the present invention will be explained with reference to FIGS. 23 and 24.

Figure 23:
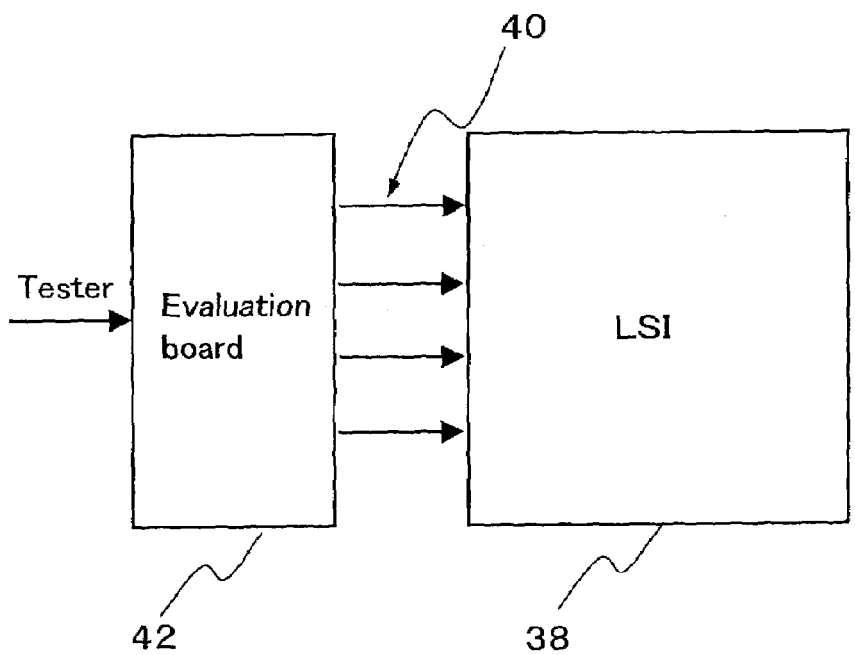
FIG. 23 illustrates an exemplary testing of providing clock signals with different duty factors from an evaluation board to an LSI in an eighth embodiment of the present invention.

FIG. 23 illustrates an example of generating the plurality of clock signals 40 with different duty factors not on the tester but on an evaluation board 42 and supplying them to the scan lines of the LSI 38, thus testing the LSI 38. The evaluation board 42 is allowed to have the function of changing duty factors, thereby generating automatically the patterns to be supplied to the LSI 38 with clock duty factors changed. In this case, the duty factors of the signals to be supplied from the tester to the evaluation board 42 do not have to be processed. By adding the function of changing duty factors to the evaluation board 42, it is possible to lower power consumption at the time of scanning the LSI 38 and improve a test accuracy while simplifying cares during designing.

Figure 24:
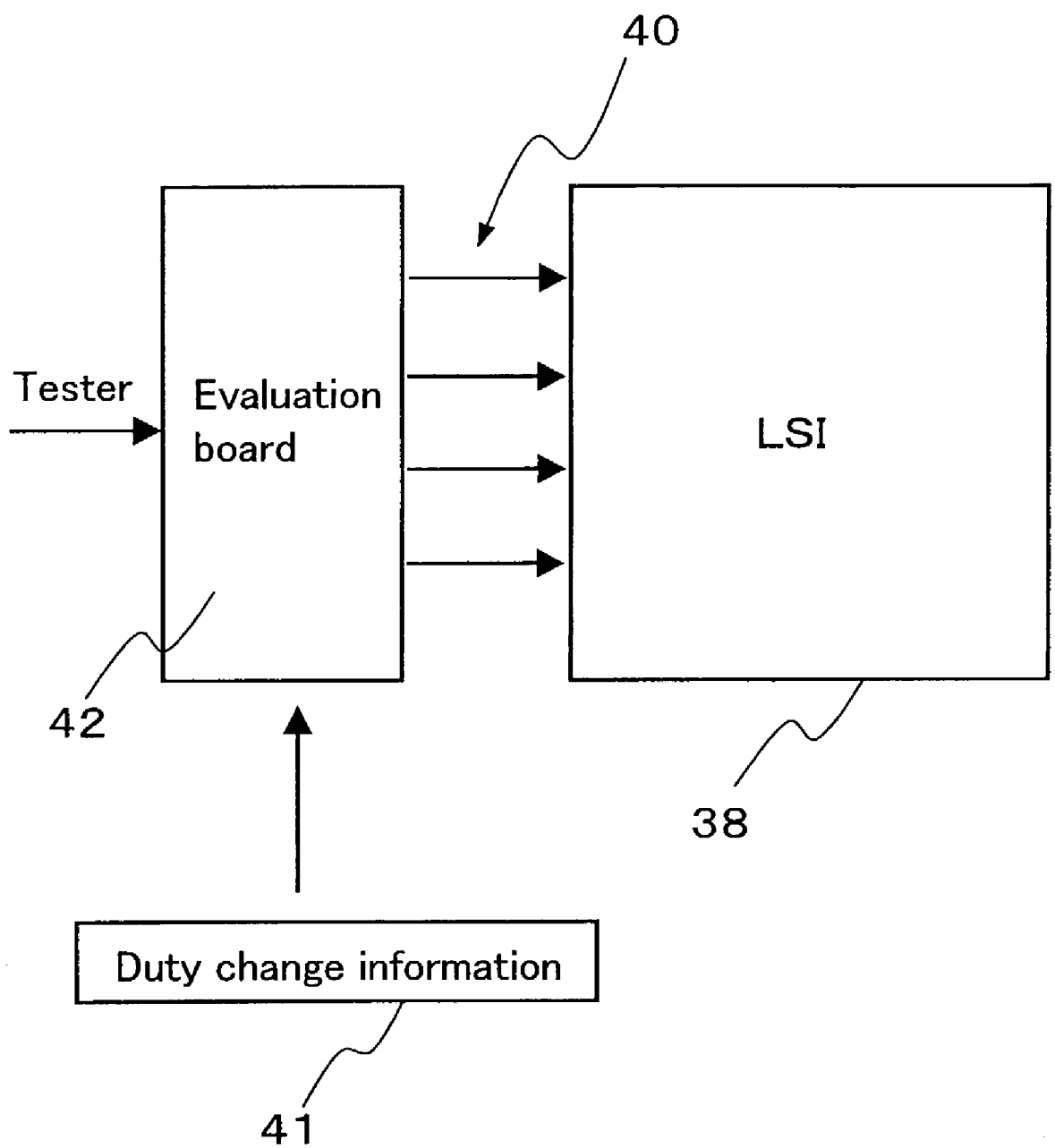
FIG. 24 illustrates an example of providing duty change information to the evaluation board in the method shown in FIG. 23.
Figure 25:
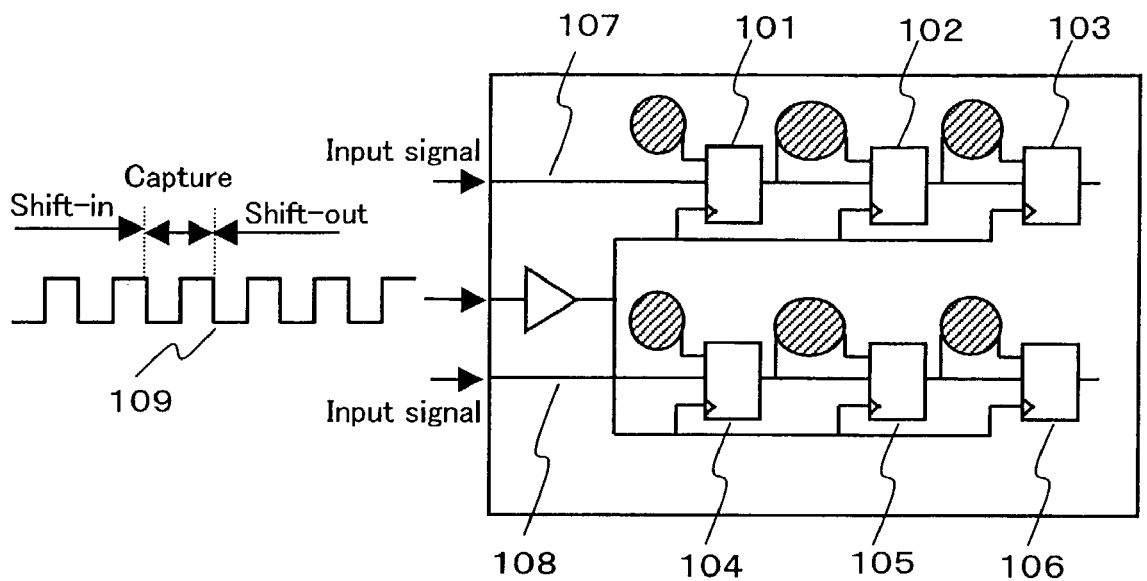
FIG. 25 illustrates a scan testing method in a conventional example.

FIG. 24 illustrates an example of supplying the evaluation board 42 with circuit information of the scan lines and the like as the duty change information 41. Based on the duty change information 41, scan clocks whose duty factors are changed according to this information are generated automatically, and the plurality of clock signals 40 with different duty factors are supplied from the evaluation board 42 to the scan lines of the LSI 38, thus testing the LSI 38. As the duty change information 41 to be supplied to the evaluation board 42, information on how to change duty factors of the scan lines from placement and routing information or the placement and routing information itself may be included. This makes it possible to change the duty factors more accurately and efficiently for reducing the power consumption.

The invention may be embodied in other specific forms without departing from the spirit or essential characteristics thereof. The embodiments disclosed in this application are to be considered in all respects as illustrative and not restrictive, the scope of the invention being indicated by the appended claims rather than by the foregoing description, all changes that come within the meaning and range of equivalency of the claims are intended to be embraced therein.

What is claimed is:

1. In a method for designing a semiconductor integrated circuit including a plurality of clock groups which are designed to be supplied with their different respective clock signals supplied to the clock signal terminal of a scan cell; the improvement comprising:
   supplying plural kinds of clock signals for performing a scan testing respectively to the clock groups, the respective clock signals having same clock cycles and different duty factors, which is defined as a ratio of a logical high level period of the clock signal to a logical low level period of the clock signal, in a part of the clock groups,
   wherein the different duty factors of the respective clock signals allow the scan testing to shift signals on scan lines of different said clock groups at different times, thereby reducing power consumption.

2. The method for designing a semiconductor integrated circuit according to claim 1, wherein the clock signals with different duty factors are supplied respectively to the plurality of clock groups by using a duty changing part for generating a test pattern in which duty factors of scan clocks supplied for the scan testing have been changed.

3. The method for designing a semiconductor integrated circuit according to claim 2, wherein the duty factors of the clocks are changed according to an information regarding the plurality of the clock groups.

4. The method for designing a semiconductor integrated circuit according to claim 3, wherein the duty factors of the clocks are changed according to a placement and routing information of the semiconductor integrated circuit.

5. The method for designing a semiconductor integrated circuit according to claim 1, wherein the duty factors of the clocks are changed by providing the semiconductor integrated circuit with a function of changing the duty factors of the clocks to be input respectively to the plurality of clock groups.

6. The method for designing a semiconductor integrated circuit according to claim 5, wherein capture operations are synchronized based on an information of scan lines in the scan testing.

7. The method for designing a semiconductor integrated circuit according to claim 1, wherein capture operations are synchronized based on an information of scan lines in the scan testing.

8. In a method for testing a semiconductor integrated circuit by inputting clock signals for performing a scan testing respectively to a plurality of scan lines included in the semiconductor integrated circuit, the improvement comprising:

supplying plural kinds of clock signals for performing the scan testing respectively to the scan lines, the respective clock signals having same clock cycles and different duty factors, which is defined as a ratio of a logical high level period of the clock signal to a logical low level period of the clock signal, in a part of the scan lines.

9. The method for testing a semiconductor integrated circuit according to claim 8, wherein the clock signals with different duty factors are supplied to the plurality of scan lines by a duty changing part for generating a test pattern in which duty factors of scan clocks supplied for the scan testing have been changed.

10. The method for testing a semiconductor integrated circuit according to claim 8, wherein the duty factors of the clocks are changed according to an information regarding the plurality of the scan lines.

11. The method for testing a semiconductor integrated circuit according to claim 8, wherein the duty factors of the clocks are changed according to a placement and routing information of the semiconductor integrated circuit.

* * * * *